(12) United States Patent
Fastow

(10) Patent No.: US 6,525,959 B1
(45) Date of Patent: Feb. 25, 2003

(54) NOR ARRAY WITH BURIED TRENCH SOURCE LINE

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/917,178

(22) Filed: Jul. 30, 2001

(51) Int. Cl.$^7$ ................................................ G11C 16/04
(52) U.S. Cl. ............................ 365/185.01; 365/185.05; 365/185.33
(58) Field of Search ..................... 365/185.01, 185.05, 365/185.33; 257/315, 316; 438/257

(56) References Cited

U.S. PATENT DOCUMENTS

| | | | | |
|---|---|---|---|---|
| 5,646,888 A | * | 7/1997 | Mori | 365/185.33 |
| 6,031,765 A | * | 2/2000 | Lee et al. | 365/185.29 |
| 6,239,465 B1 | * | 5/2001 | Nakagawa | 257/331 |
| 6,274,907 B1 | * | 8/2001 | Nakagawa | 257/354 |

* cited by examiner

Primary Examiner—Huan Hoang
Assistant Examiner—Gene N. Auduong

(57) ABSTRACT

A flash memory array is disclosed. The memory array includes multiple memory cells, each cell having a source, a drain, a floating gate and a control gate organized in rows and columns. In addition the array includes wordlines connecting the control gates of memory cells in a row, bitlines connecting the drains of memory cells in a column, source lines connecting the sources of memory cells in a row and a terminal line connecting the source lines to a source voltage supply. Moreover, the array includes conductive lines connecting the source lines, where each source in each cell in a row of memory cells is coupled to a source coupled resistor, and each source coupled resistor is coupled to the source coupled resistor of an adjacent cell through a separate resistor.

10 Claims, 8 Drawing Sheets

NOR ARRAY WITH BURIED TRENCH SOURCE LINE

BACKGROUND OF THE INVENTION

1. Field of the Invention

This invention relates generally to the art of microelectronic integrated circuits. More specifically, this invention relates to high performance microelectronic flash memory cells and to the art of manufacturing high performance microelectronic flash memory cells. Even more specifically, this invention relates to high performance microelectronic flash memory cells with reduced common source resistance and to the art of manufacturing high performance microelectronic flash memory cells with reduced common source resistance.

2. Discussion of the Related Art

A microelectronic flash or block erase Electrically Erasable Programmable Read-Only Memory (Flash EEPROM) includes an array of cells that can be independently programmed and read. The size of each cell and thereby the memory array are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells in a either a column or a row are connected together and each column or row common source connections are then connected to a common source voltage $V_{SS}$. This arrangement is known as a NOR flash memory configuration.

A cell is programmed by applying a voltage, typically 9 volts to the control gate, applying a voltage of approximately 5 volts to the drain and grounding the common voltage source $V_{SS}$, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the common source voltage $V_{SS}$, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, a cell is erased by applying a relatively high voltage, typically 12 volts, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of minus 10 volts to the control gate, applying 5 volts to the source and allowing the drain to float. Another method of erasing is by applying 5 V to the P-well and minus 10 V to the control gate while allowing the source/drain to float.

As discussed above, the cells are arranged in rows and columns with the sources connected to a common line either in a row or a column. Because there is finite resistance in the source lines, the number of cells between each source line contact is limited.

Therefore, what is needed is a memory array and a method to manufacture the memory array that reduces the source line resistance in high density flash arrays without increasing the short channel effects.

SUMMARY OF THE INVENTION

According to the present invention, the foregoing and other objects and advantages are obtained with a flash memory array that includes conductive lines connecting the source lines.

In accordance with one aspect of the invention, a flash memory array composed of multiple memory cells organized in rows and columns with source lines connecting the sources of memory cells in a row and buried conductive lines transverse to the source lines connecting the source lines with the source lines connected to a source voltage line parallel to the bitlines.

In accordance with another aspect of the invention, the buried conductive lines are formed at the bottom of trenches formed in a semiconductor substrate in which the flash memory is to be formed.

In accordance with another aspect of the invention, a flash memory array composed of multiple memory cells organized in rows and columns with source lines connecting the sources of memory cells in a row and buried conductive lines transverse to the source lines connecting the source lines with the buried conductive lines connected to a source voltage line parallel to the wordlines The described invention thus provides a flash memory array with reduced $V_{SS}$ resistance without degrading the short channel behavior of the core cell.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 4A shows a portion of a semiconductor substrate in and on which the flash memory array is manufactured;

FIG. 4B shows the portion of the semiconductor substrate as shown in FIG. 4A after trenches have been etched in the semiconductor substrate;

FIG. 4C shows the portion of the semiconductor substrate as shown in FIG. 4B with a stacked gate structure and a source mask formed exposing portions of the semiconductor substrate and showing the exposed portion of the semiconductor substrate being implanted with n$^+$ ions (a self-aligned implant);

FIG. 4D shows the portion of the semiconductor substrate as shown in FIG. 4C with the source mask removed and showing the portions of the semiconductor substrate having been implanted with n$^+$ ions;

FIG. 4E is a cross sectional view through the source regions of the portion of the semiconductor substrate as shown in FIG. 4D;

FIG. 4F is a cross sectional view through the non-source regions of the portion of the semiconductor substrate as shown in FIG. 4D;

FIG. 5A shows a portion of a semiconductor substrate in and on which the flash memory array is to be manufactured;

FIG. 5B shows the portion of the semiconductor substrate as shown in FIG. 5A with trench masks formed;

FIG. 5C shows the portion of the semiconductor substrate as shown in FIG. 5B after trenches with slanted sidewalls have been formed;

FIG. 5D shows the portion of the semiconductor substrate as shown in FIG. 5C with sidewall liners formed on the slanted sidewalls of the trenches;

FIG. 5E shows the portion of the semiconductor substrate as shown in FIG. 5D being implanted with n$^+$ ions;

FIG. 5F shows the portion of the semiconductor substrate as shown in FIG. 5E with the trench masks and sidewall liners removed and indicating the implanted n$^+0$ ions in the bottoms of the trenches;

FIG. 5G is a cross sectional view through the portion of the semiconductor substrate as shown in FIG. 5F;

FIG. 5H shows the portion of the semiconductor substrate as shown in FIG. 5F with portions of the trenches filled with an oxide, a stacked gate structure formed and a source mask formed and exposing a portion on the semiconductor substrate and the exposed portion of the semiconductor being implanted with n$^+$ ions to form a common source line;

FIG. 5I is a cross sectional view through the non-source region of the semiconductor substrate as shown in FIG. 5H with the source mask removed; and FIG. 5J is a cross sectional view through the source region of the semiconductor substrate as shown in FIG. 5H.

DETAILED DESCRIPTION

Reference is now made in detail to a specific embodiment or specific embodiments of the present invention that illustrate the best mode or modes presently contemplated by the inventors for practicing the invention.

Figure 1:
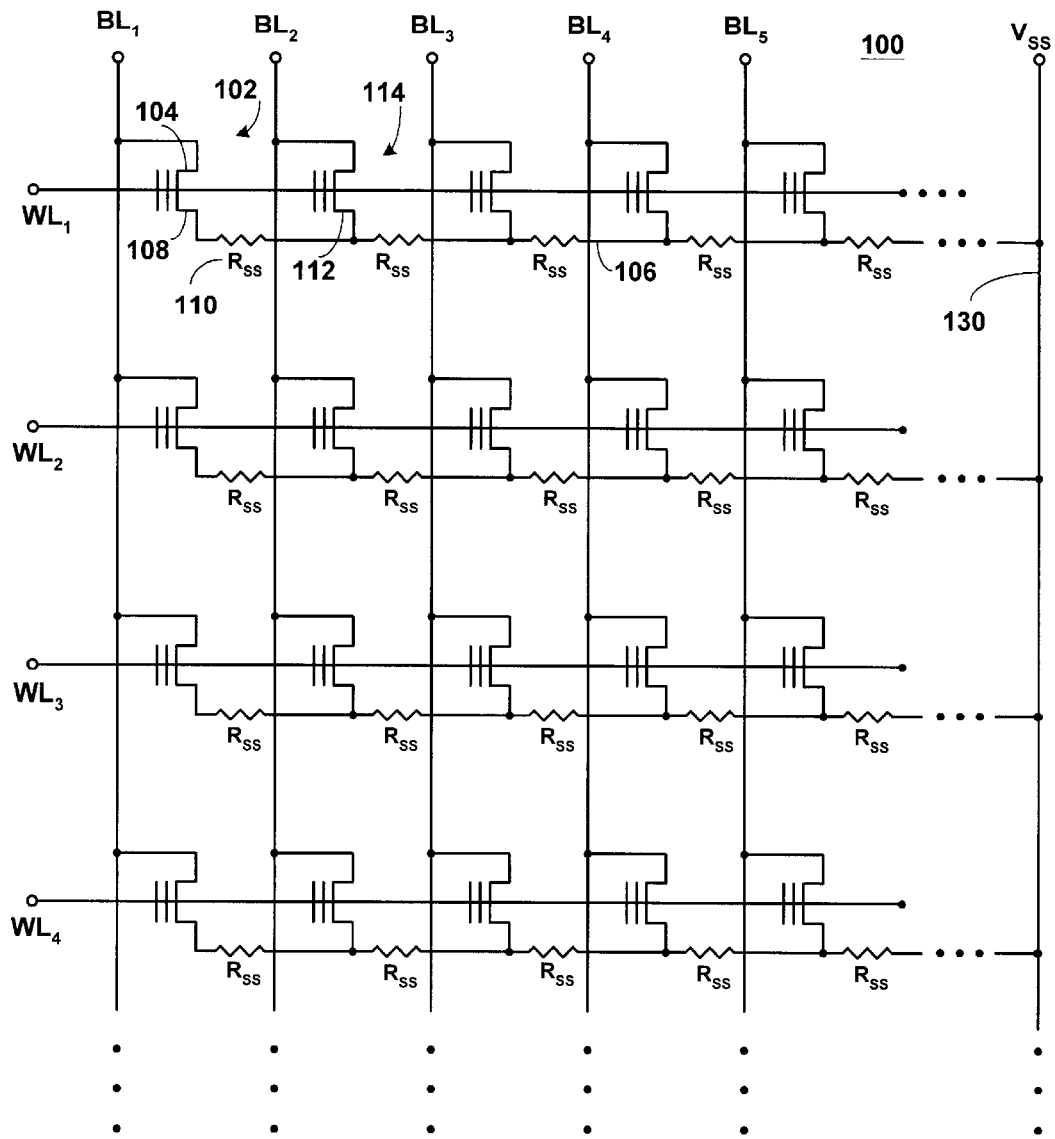
FIG. 1 is a schematic diagram of a typical flash memory array with cells arranged in rows and columns and having the common sources connected in rows showing the source line resistance $R_{SS}$ between each source connection.

FIG. 1 illustrates a basic configuration of a NOR type flash Electrically Programmable Read-Only Memory (EEPROM) 100 to which the present invention is advantageously applied. The flash memory 100 comprises a plurality of core or memory cells, such as memory cell 102, which are arranged in a rectangular matrix or array of rows and columns. Each row is associated with a wordline (WL$_n$), whereas each column is associated with a bitline (BL$_n$). The drains of each memory cell in a column are connected to a bitline, for example, drain 104 of memory cell 102 is connected to BL$_l$. Depending upon the operation being carried out, that is, whether programming, reading or erasing is the operation, appropriate voltages for the operation are applied to the wordlines by a wordline driver (not shown), appropriate voltages for the operation are applied to the bitlines by a bitline driver and an appropriate voltage is applied to V$_{SS}$. The sources of each memory cell in a row are connected to a common source line, such as source line 106. For example, source 108 of memory cell 102 is connected to the source line 106. Between each source, there are finite resistances R$_{SS}$, such as R$_{SS}$ 110, that when combined affect the various operations of the flash memory cell 100. As can be appreciated, the voltage at source 108 would be different than the voltage at source 112 of memory cell 114 whatever the value of V$_{SS}$ because of the voltage drop across the resistance R$_{SS}$.

Figure 2:
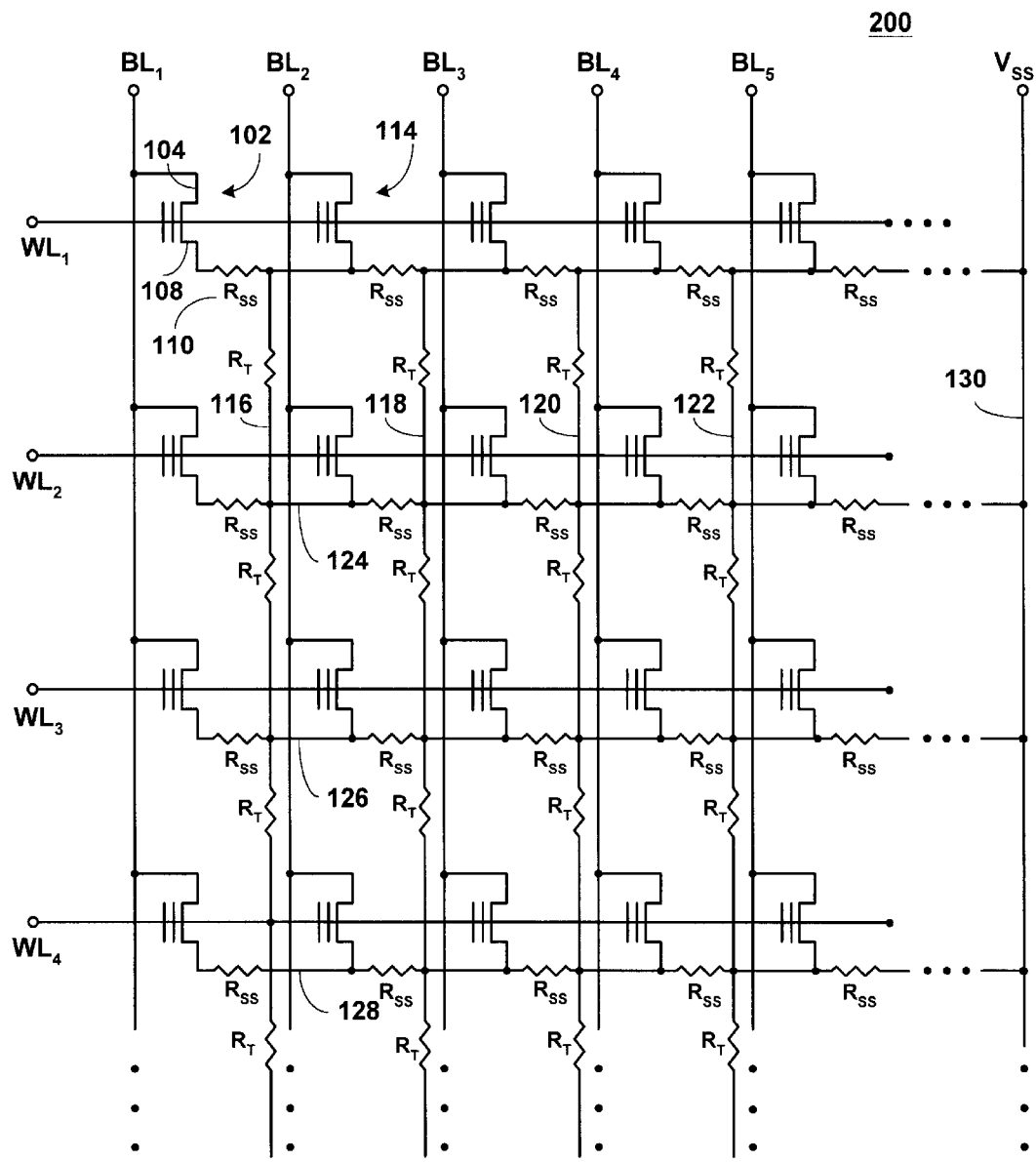
FIG. 2 is a schematic diagram of a first embodiment of the present invention of a flash memory array similar to FIG. 1 with buried trench line connections to the common source lines with the common source lines in rows connecting to $V_{SS}$.

FIG. 2 is a schematic diagram 200 of a first embodiment of the present invention of a flash memory array with buried trench line connections to the common source lines with the common source lines 106 in rows connected to V$_{SS}$ (lines running parallel to the BLs. Elements the same as the elements in FIG. 1 have the same identification numbers. Buried conductive trench lines 116, 118, 120 & 122 are connected to the source lines 106, 124, 126 & 128. The buried conductive trench lines 116, 118, 120 & 122 have finite resistance between connections. The resistance between connections of the buried conductive trench lines is denoted as R$_T$. The connection of the buried trench line and the source lines reduces the effective source resistance, since now many parallel lines 106 conduct the current from the cell to the V$_{SS}$ line 130. In the case that R$_T$<<R$_S$ the effective source resistance can be reduced by an order of magnitude. It is noted that only one V$_{SS}$ contact line at 130 is shown, however other V$_{SS}$ contact lines are included in memory arrays.

Figure 3:
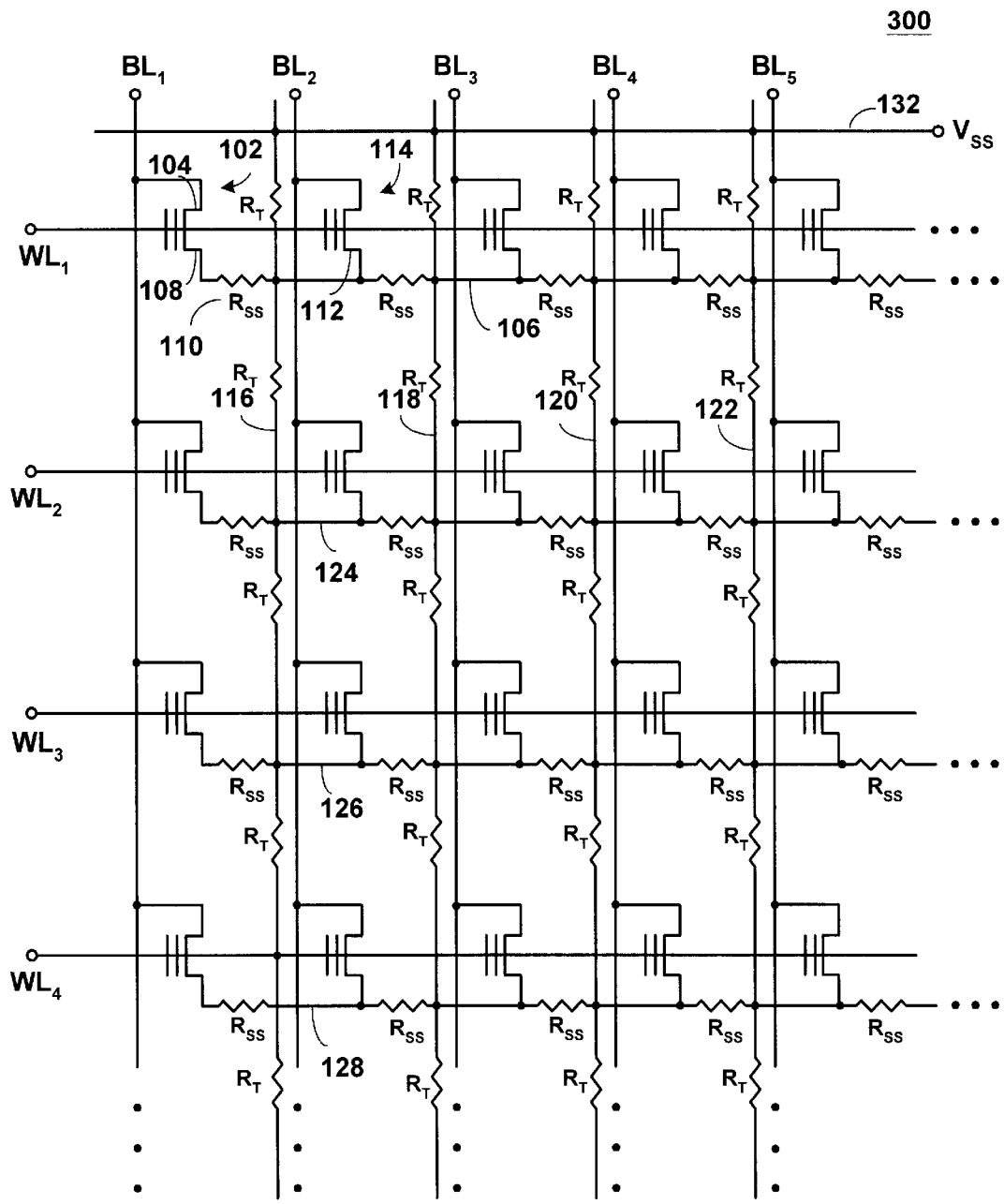
FIG. 3 is a schematic diagram of a second embodiment of the present invention of a flash memory array similar to FIG. 1 with buried trench line connections to the common source lines with the common source lines in columns connecting to $V_{SS}$.

FIG. 3 is a schematic diagram 300 of a second embodiment of the present invention of a flash memory array with buried trench line connections to the common source lines 106 with the common source line in rows connected to the V$_{SS}$ line running parallel to the WLs. Elements the same as the elements in FIGS. 1 & 2 have the same identification numbers.

The buried conductive trench lines 116, 118, 120 & 122 have finite resistance between connections. The resistance between connections of the buried conductive trench lines is denoted as R$_T$. The connection of the buried trench line and the source lines reduces the effective source resistance, since now many parallel lines 118 conduct the current from the cell to the V$_{SS}$ line 132. In the case that R$_T$<<R$_S$, the effective source resistance can be reduced by an order of magnitude. It is noted that only one V$_{SS}$ contact line at 132 is shown, however other V$_{SS}$ contact lines are included in memory arrays.

FIGS. 4A–4F show a portion of the steps necessary to manufacture the typical flash memory array as shown in FIG. 1.

Figure 4A:
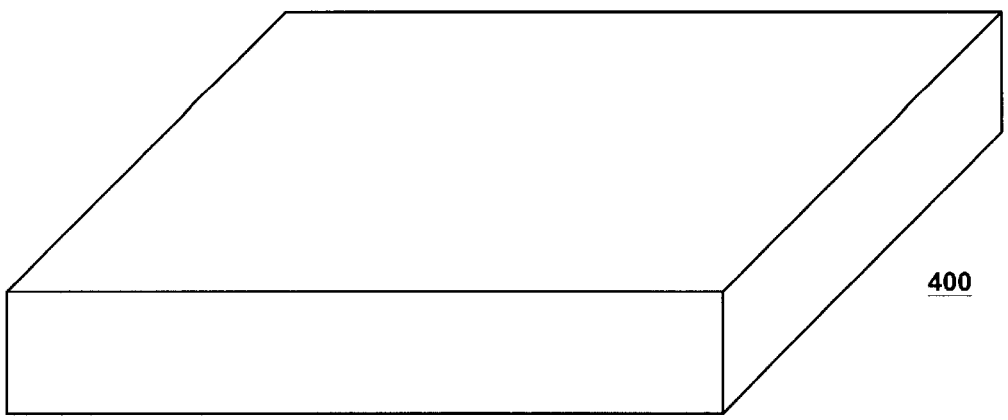
FIGS. 4A–4F show a portion of the steps necessary to manufacture the typical flash memory array as shown in FIG. 1.

FIG. 4A shows a portion 400 of a semiconductor substrate in and on which the flash memory array will be manufactured.

Figure 4B:
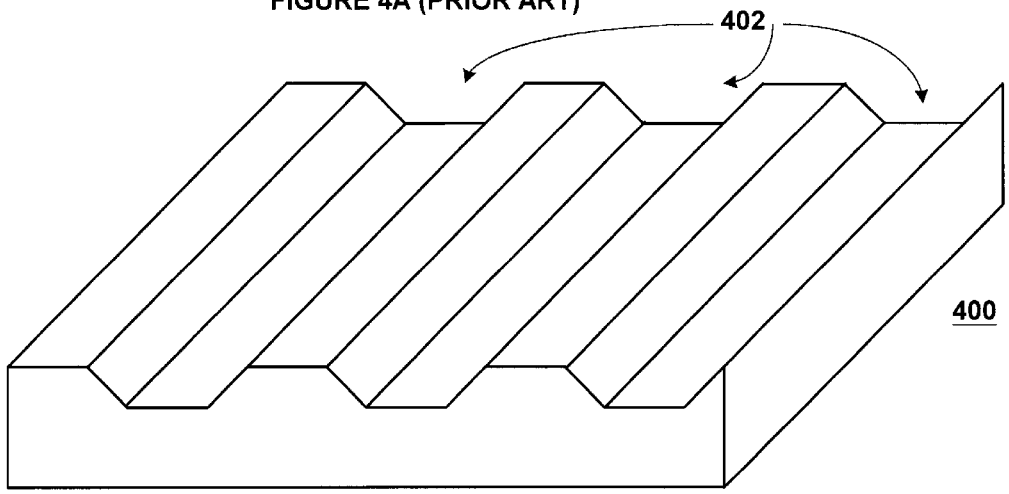

FIG. 4B shows the portion 400 of the semiconductor substrate as shown in FIG. 4A with trenches 402 shown etched in the surface of the portion 400 of the semiconductor substrate. The methods of etching trenches 402 in a surface of a substrate are well known in the semiconductor manufacturing art and will not be discussed.

Figure 4C:
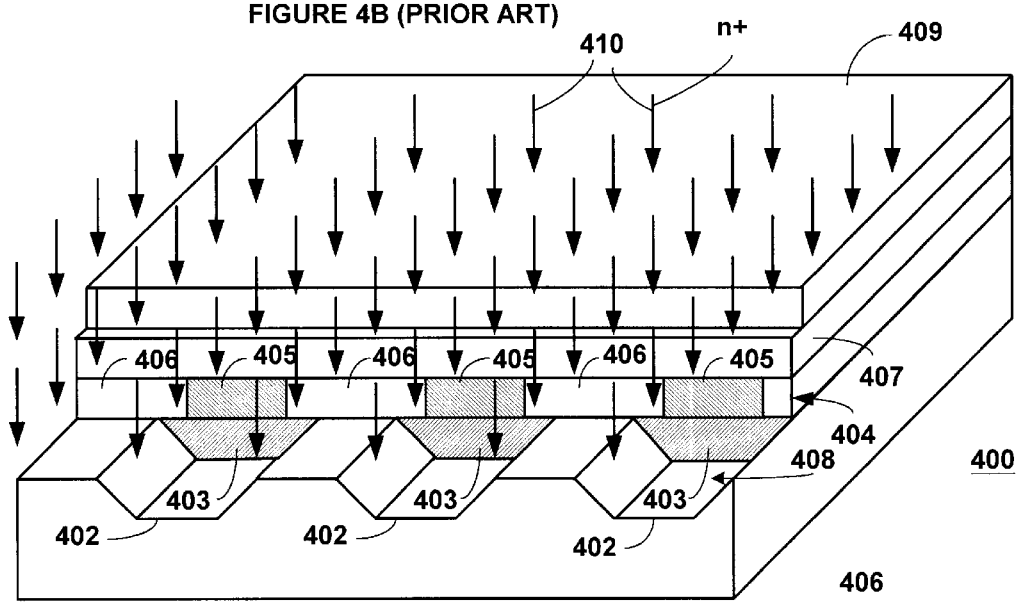

FIG. 4C shows the portion 400 of the semiconductor substrate as shown in FIG. 4B with portions of the trenches 402 filled with an oxide 403 and a stacked gate structure 404 with a source mask 409 formed on the stacked gate structure 404. The stacked gate structure 404 includes isolation structures 405 and structures 406 that include a layer of tunnel oxide (not shown) and floating gate (not shown) and a layer of ONO (oxide-nitride-oxide) (not shown). The layer 407 is a control gate structure and a word line structure. The stacked gate structure and the method of forming the stacked gate structure is well known in the art and will not be discussed. The source mask 409 is developed to expose source regions, such as region 408. After the source mask 409 is developed and the source regions, such as 408 are exposed, n$^+$ ions are implanted in a self-aligned implant as shown by arrows 410.

Figure 4D:
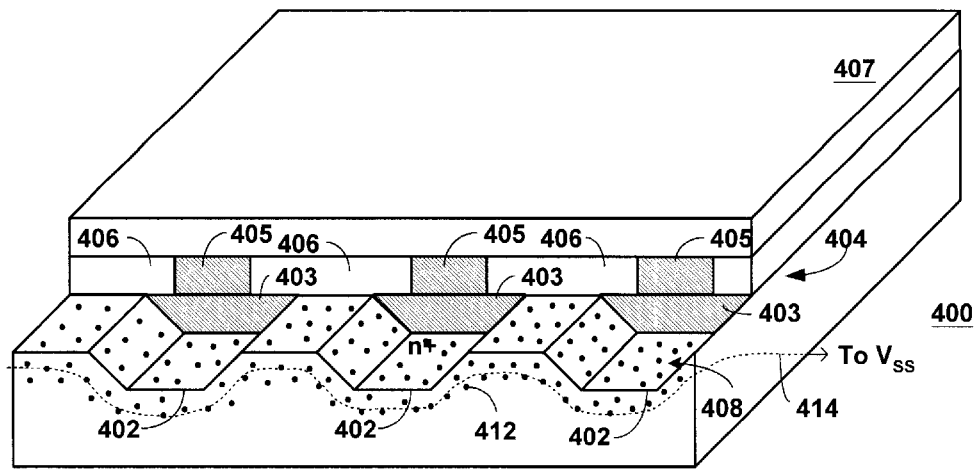

FIG. 4D shows the portion 400 of the semiconductor substrate as shown in FIG. 4C with the source mask 409 removed and the implanted n$^+$ ions represented by dots, such as dot 412. The dotted line 414 indicates generally the path of the common source line that will connect to the V$_{SS}$ terminal.

Figure 4E:
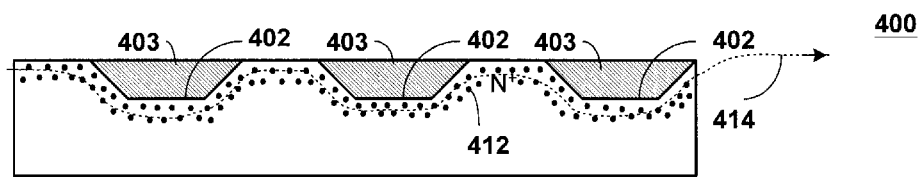

FIG. 4E is a cross sectional view through the source region 408 shown in FIG. 4D. The dotted line 414 indicates generally the path of the common source line that will connect to the V$_{SS}$ terminal. The trenches 402 are shown filled with oxide as indicated at 403.

Figure 4F:
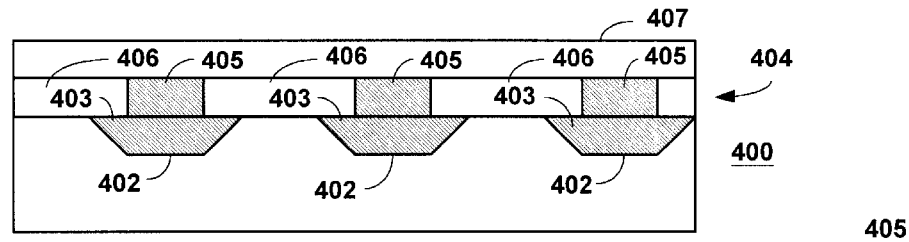

FIG. 4F is a cross sectional view through the non-source regions of the portion 400 of the semiconductor substrate and indicates that none of the n$^+$ ions are in the semiconductor substrate in the non-source regions.

FIGS. 5A–5J show a portion of the steps necessary to manufacture the flash memory array in accordance with the embodiments of the present invention as shown in FIGS. 2 & 3.

Figure 5A:
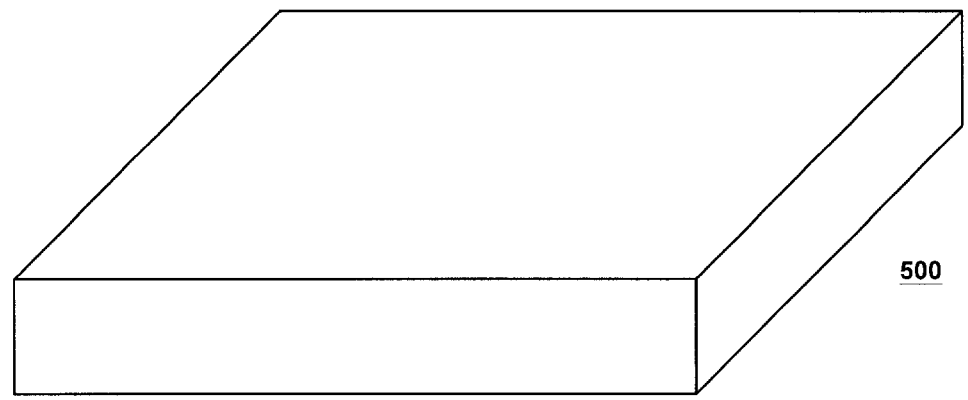
FIGS. 5A–5J show a portion of the steps necessary to manufacture the flash memory array in accordance with the present invention as shown in FIGS. 2 & 3.

FIG. 5A shows a portion 500 of a semiconductor substrate in and on which the flash memory array will be manufactured.

Figure 5B:
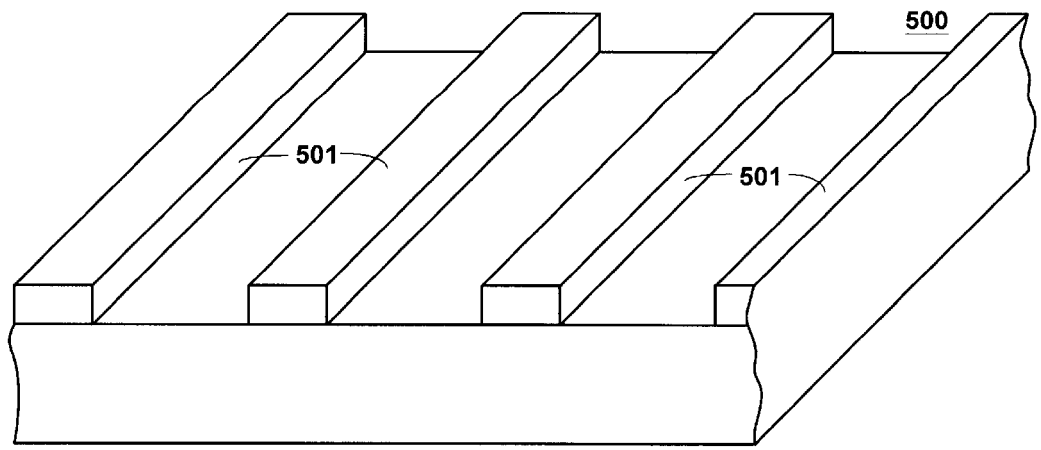

FIG. 5B shows the portion 500 of the semiconductor substrate as shown in FIG. 5A with trench masks 501 formed on the surface of the portion 500 of the semiconductor substrate. The trench masks 501 are hard masks and can be used in both self-aligned and non self-aligned trench formation processes.

Figure 5C:
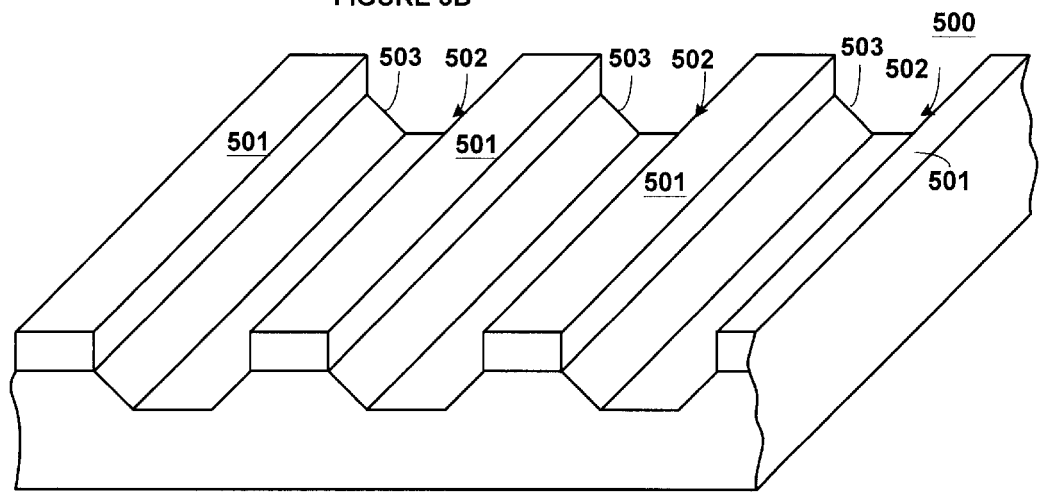

FIG. 5C shows the portion 500 of the semiconductor substrate as shown in FIG. 5B with trenches 502 having slanted walls 503 etched in the surface of the portion 500 of the semiconductor substrate. The methods of etching trenches 502 in a surface of a substrate are well known in the semiconductor manufacturing art and will not be discussed.

Figure 5D:
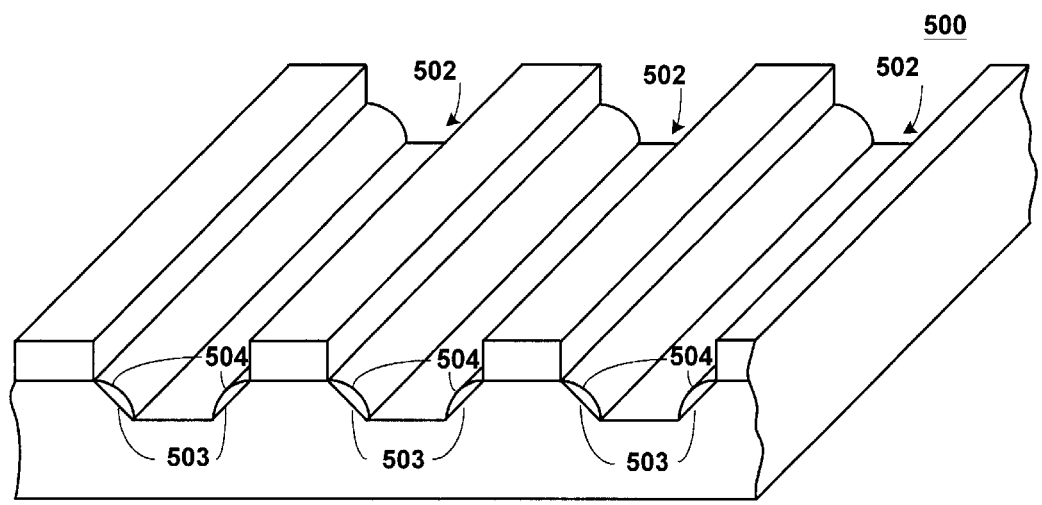

FIG. 5D shows the portion 500 of the semiconductor substrate as shown in FIG. 5C with sidewall liners 504 formed on the slanted walls 503. The sidewall liners are formed from an oxide and serve to protect the underlying slanted walls 503 from being implanted with ions in a subsequent process.

Figure 5E:
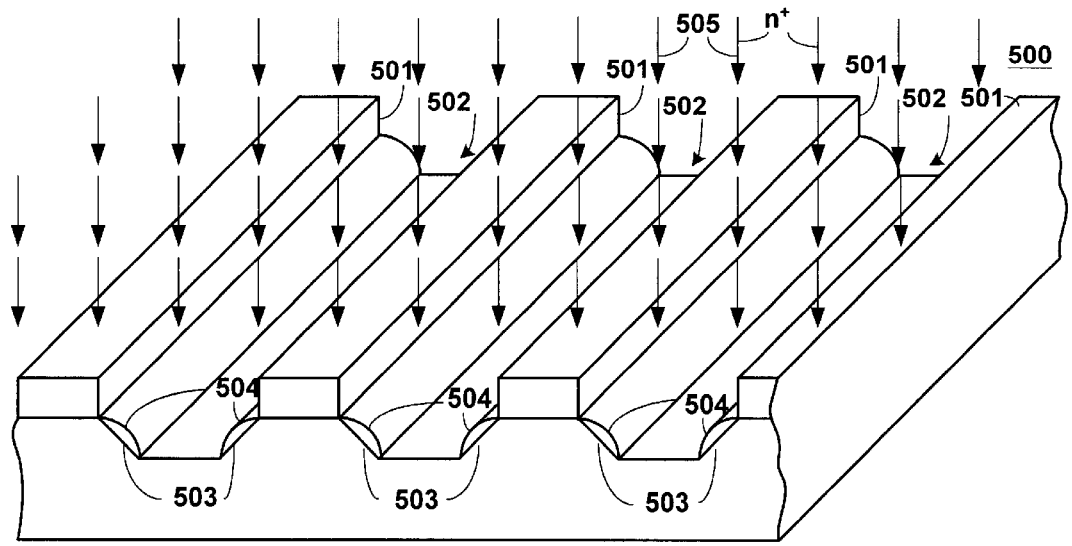

FIG. 5E shows the portion 500 of the semiconductor substrate as shown in FIG. 5D being implanted with n$^+$ ions, indicated by arrows 505.

Figure 5F:
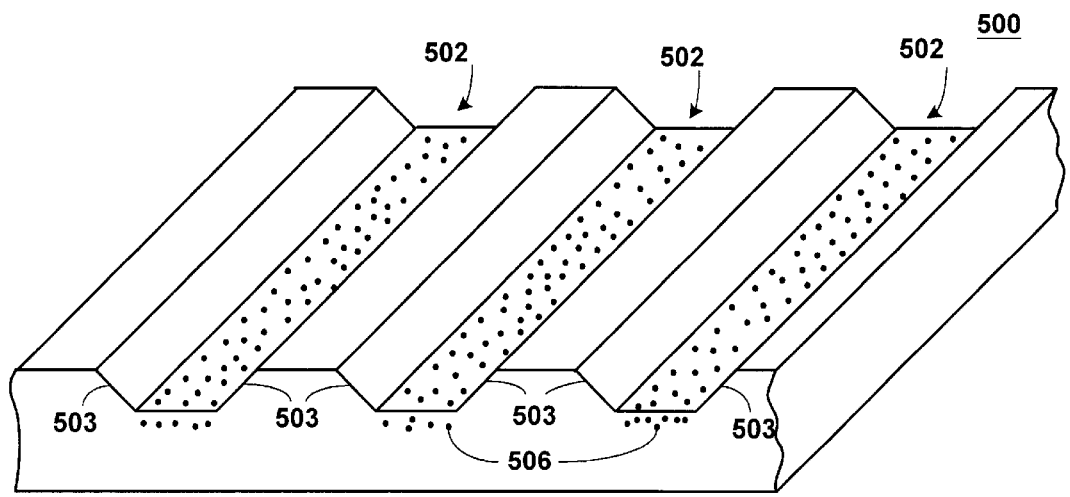

FIG. 5F shows the portion 500 of the semiconductor substrate as shown in FIG. 5E with the hard masks 501 and the sidewall liners 504 removed. The dots 506 represent the n$^+$ ions that have been implanted in the portion 500 of the semiconductor substrate.

Figure 5G:
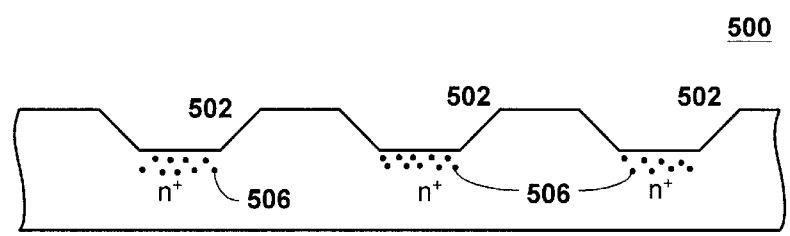

FIG. 5G is a cross sectional view through the portion 500 of the semiconductor substrate as shown in FIG. 5F and indicates the implanted n$^+$ ions at 506 at the bottom of the trenches 502.

Figure 5H:
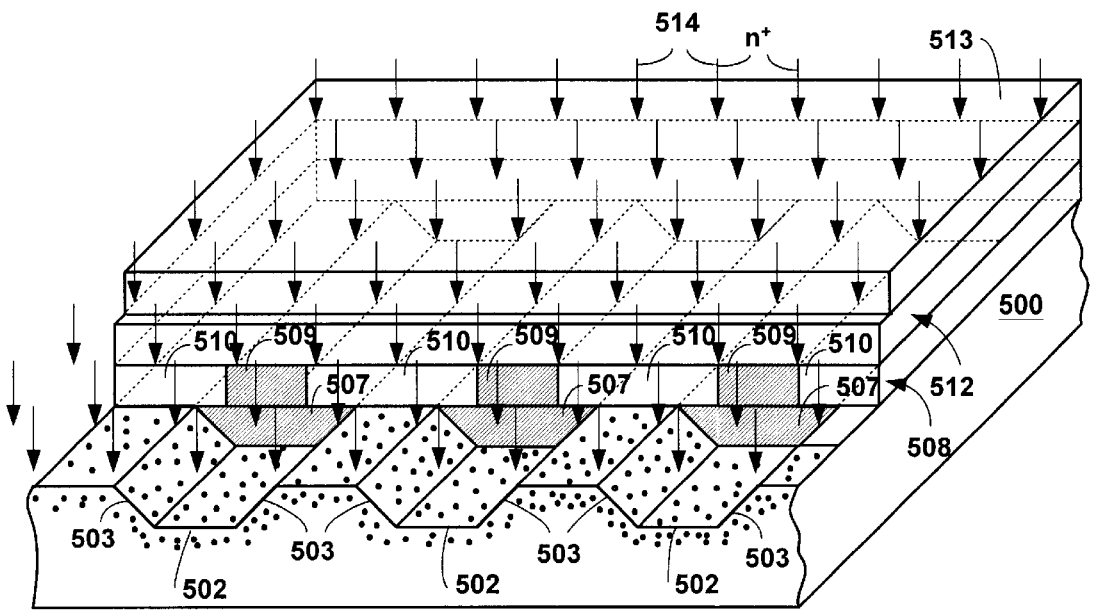

FIG. 5H shows the portion 500 of the semiconductor substrate as shown in FIG. 5F with portions of the trenches 502 filled with an oxide at 507 and with a stacked gate structure 508 formed. The stacked gate structure 508 includes isolation structures 509 formed on the trench oxide regions 507 and gate structures 510. As is known in the semiconductor manufacturing art, the gate structures 510 typically include a tunnel oxide (not shown), a floating gate (not shown) and a layer of ONO (oxide-nitride-oxide) (not shown). The layer 512 is a control gate and wordline structure. A source mask 513 is formed on the layer 512. The n$^+$ ions are shown being implanted in a self-aligned implant as indicated by arrows 514.

Figure 5I:
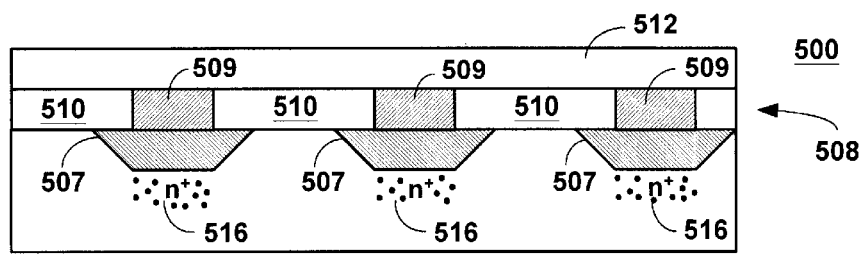

FIG. 5I is a cross sectional view through the non-source region of the portion 500 of the semiconductor substrate with the source mask 513 removed and with the dots 516 showing the n$^+$ ions at the bottom of the trenches 502. Also shown are the trenches 502 filled with oxide 507, stacked gate structures 508 and the layer 512.

Figure 5J:
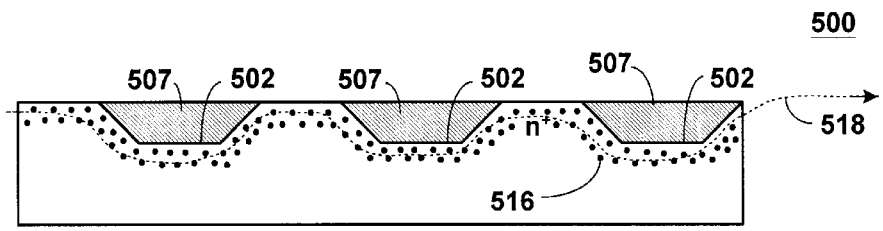

FIG. 5J is a cross sectional view through the source region of the portion 500 of the semiconductor substrate and with the dots 516 indicating the n$^+$ ions making up the common source line. The dotted line 518 indicates generally the path of the common source line, which will connect to the V$_{SS}$ terminal line 130 as shown in FIG. 2B.

Thus, the described invention provides a flash memory array with reduced V$_{SS}$ resistance without degrading the short channel behavior of the core cell.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A flash memory array, comprising:
   multiple memory cells, each cell having a source, a drain, a floating gate and a control gate organized in rows and columns;

wordlines connecting the control gates of memory cells in a row;

bitlines connecting the drains of memory cells in a column;

source lines connecting the sources of memory cells in a row;

a terminal line connecting the source lines to a source voltage supply; and conductive lines connecting the source lines, wherein each source in each cell in a row of memory cells is coupled to a source coupled resistor, and each source coupled resistor is coupled to the source coupled resistor of an adjacent cell through a separate resistor.

2. The flash memory array of claim 1 wherein the conductive lines connecting the source lines are buried conductive lines.

3. The flash memory array of claim 2 wherein the buried conductive lines are formed at the bottom of trenches formed in a semiconductor substrate in which the flash memory is to be formed.

4. The flash memory array of claim 3 wherein the trenches are formed in the substrate parallel to the bitlines.

5. The flash memory array of claim 4 wherein the terminal line connecting the source lines to a source voltage supply is parallel to the bitlines.

6. A flash memory array, comprising:

multiple memory cells, each cell having a source, a drain, a floating gate and a control gate organized in rows and columns;

wordlines connecting the control gates of memory cells in a row;

bitlines connecting the drains of memory cells in a column;

source lines connecting the sources of memory cells in a row;

conductive lines connecting the source lines; and a terminal line connecting the conductive lines to a source voltage supply, wherein each source in each cell in a row of memory cells is coupled to a source coupled resistor, and each source coupled resistor is coupled to the source coupled resistor of an adjacent cell through a separate resistor.

7. The flash memory array of claim 6 wherein the conductive lines connecting the source lines are buried conductive lines.

8. The flash memory array of claim 7 wherein the buried conductive lines are formed at the bottom of trenches formed in a semiconductor substrate in which the flash memory is to be formed.

9. The flash memory array of claim 8 wherein the trenches are formed in the substrate parallel to the bitlines.

10. The flash memory array of claim 9 wherein the terminal line connecting the buried conductive lines is parallel to the wordlines.

* * * * *